United States Patent

Cugini

[11] Patent Number: 5,898,313
[45] Date of Patent: Apr. 27, 1999

[54] TEST FIXTURE FOR TWO SIDED CIRCUIT BOARDS

[76] Inventor: Mario A. Cugini, 2091 Elevado Hills Dr., Vista, Calif. 92084

[21] Appl. No.: 08/818,743

[22] Filed: Mar. 14, 1997

[51] Int. Cl.$^6$ ........................................................ G01R 1/04
[52] U.S. Cl. ............................................ 324/758; 324/761
[58] Field of Search ..................................... 324/754, 755, 324/758, 761, 762; 439/482, 824

[56] References Cited

U.S. PATENT DOCUMENTS

| | | | |
|---|---|---|---|
| 3,970,934 | 7/1976 | Aksu | 324/754 |
| 4,841,241 | 6/1989 | Hilz et al. | 324/754 |
| 4,912,400 | 3/1990 | Plante | 324/754 |

Primary Examiner—Vinh P. Nguyen
Attorney, Agent, or Firm—Calif Tervo

[57] ABSTRACT

A test interface between a two sided circuit board to be tested and a test controller and it generally includes an upper and a lower test fixture each including personality plates having bores for simultaneously guiding translation pins into contact with test nodes on the circuit board under test. Circuit board tooling bores are mounted on tooling pins in the personality plates. The tooling pins tapered to a diameter slightly larger than the diameter of the circuit board tooling bores. One or both personality plates are mounted such that they may move responsive to forces exerted on the tooling pins because of nonalignment such that the forces tend to equalize. This results in better overall alignment.

4 Claims, 2 Drawing Sheets

TEST FIXTURE FOR TWO SIDED CIRCUIT BOARDS

BACKGROUND OF THE INVENTION

1. Field of the Invention

This invention relates in general to a test fixture for simultaneously testing electrical circuitry on both sides of a circuit holder such as a printed circuit (PC) board, wired backplane or rigid or flex ceramics. The invention more specifically discloses a fixture which more accurately places translation pins in contact with the test nodes on both sides of the PC board under test.

2. Description of the Related Art

Circuit testing of a PC board involves making contact with each electrical point on a circuit and sequentially monitoring each and every circuit component and each and every circuit path. In this manner, opens, shorts, missing components, wrong components, backwards or improperly installed components, and out of tolerance components can be individually identified. Hereinafter, the term "PC board" will be used as exemplary of the circuit to be tested and is generally meant to include any other type of circuit that may be tested in the manner described herein.

A complete conventional circuit test system for testing a single-sided PC board includes a controller with measurement circuitry, an electronic switching matrix with bed of nails output, and an interface or fixture imposed between the bed of nails and the test circuit. The controller switches between various multiple contact points on the PC board while monitoring the performance of the component or circuit path. The controller is typically controlled by a test program using a microprocessor or minicomputer.

Each test interface or test fixture must be configured for each specific PC board to be tested. The test interface must make electrical connection between the bed of nails and each test node on the PC board. The typical fixture includes an array of translation pins specifically configured for the PC board, each pin having a first end for electrical contact with a node to be tested on the PC board and having a second end. The second ends of the translation pins form a standardized output grid for electrical connection to the bed of nails input grid of the switching portion. A personality plate includes translation pin bores conforming with placement of the test nodes. The personality plate bores guide the first end of the translation pins to the test nodes. The switching portion includes a standardized input grid of input contacts contacting the output grid. The switching portion includes localized circuitry controlled by the controller to select specific nodes for testing.

Two fixtures, typically an upper fixture and a lower fixture, are used for simultaneous testing of both sides of a PC board. A problem arises with regard to positioning of both fixtures with regard to the PC board. Typically, the lower test fixture personality plate includes tooling pins mounted in tooling pin bores corresponding to tooling bores in the PC board. The PC board is snugly mounted on the lower fixture personality plate tooling pins. The upper personality plate is positioned relative to alignment bores in the lower personality plate. Tolerances are accumulated from location of the PC board tooling bores to the lower personality plate tooling pins to tooling pin bores to alignment bores, through alignment pins to alignment bores in the upper personality plate to the pin bores in the upper personality plate and to the upper tooling pins. The build up of tolerances is such that the upper personality plate is often not correctly positioned relative to the PC board circuitry and its translation pins are not guided to the upper test nodes on the PC board.

Therefore, there has been a need for an improved test interface that provides for more accurate placement of translation pin contacts when testing a double-sided PC board.

SUMMARY OF THE INVENTION

This invention is a test interface between a two sided circuit board to be tested and a test controller and it generally comprises an upper and a lower test fixture each including personality plates having bores for simultaneously guiding translation pins into contact with test nodes on the circuit board under test.

Circuit board tooling bores are mounted on tooling pins in the personality plates. The tooling pins tapered to a diameter slightly larger than the diameter of the circuit board tooling bores. One or both personality plates are mounted such that they may move responsive to forces exerted on the tooling pins because of nonalignment such that the forces tend to equalize. This results in better overall alignment.

Other features and many attendant advantages of the invention will become more apparent upon a reading of the following detailed description together with the drawings in which like reference numerals refer to like parts throughout.

DETAILED DESCRIPTION OF THE INVENTION

Figure 1:
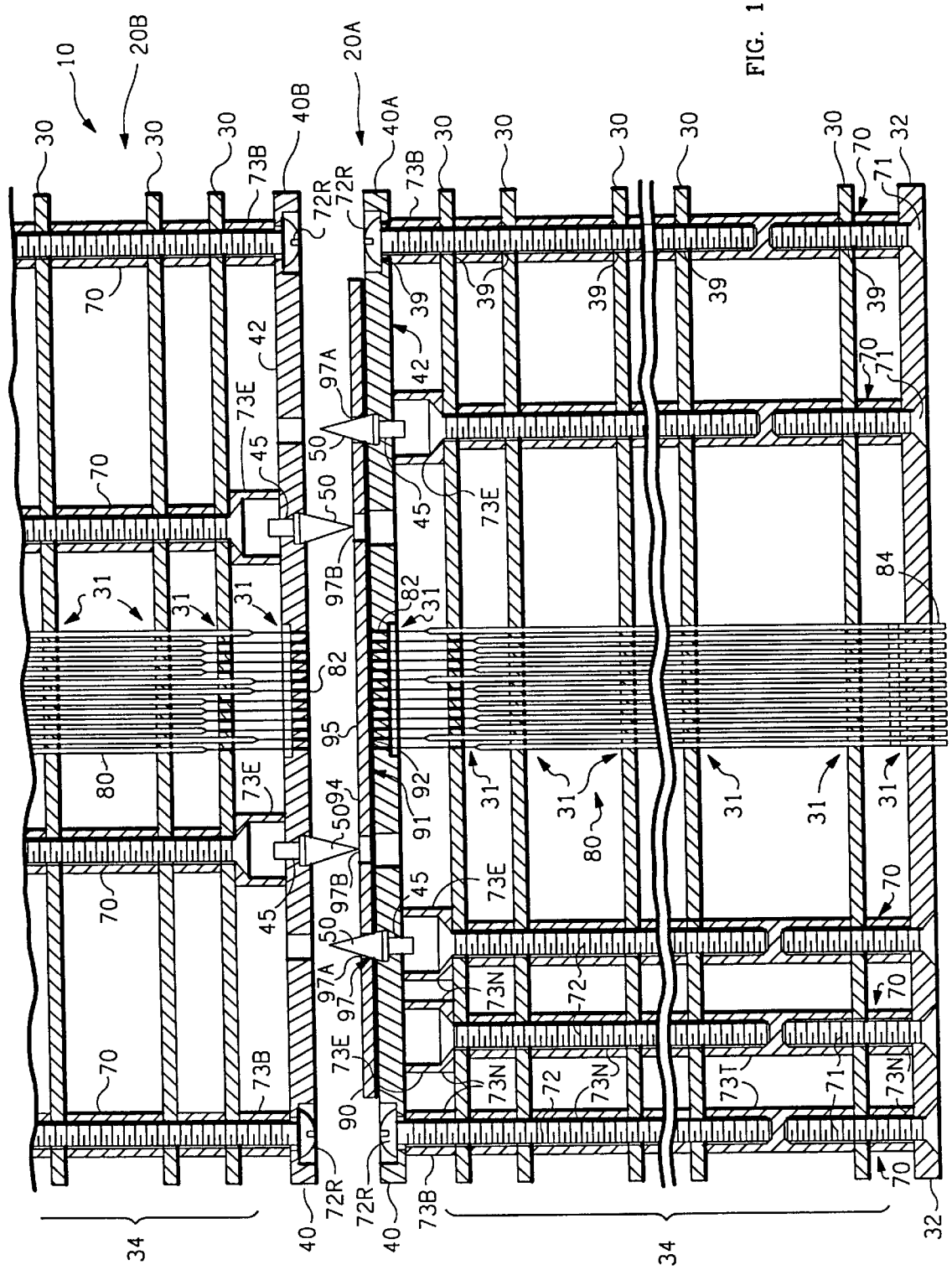
FIG. 1 is a side elevation view, partially in section and partially cut away, of a preferred embodiment of the test interface of the invention.

With reference now to the drawings, there is shown in FIG. 1 a side elevation view, partially in section and partially cut away, of a preferred embodiment of the test interface, denoted generally as 10, of the invention. Most of the elements of interface 10 shown are conventional and are only shown here for clarity and completeness within this single disclosure.

Test interface 10 is placed between a circuit board, denoted generally as 90, to be tested and a test controller, not shown. Circuit board 90 has a first side 91 having a circuit 92, a second side 94 having a circuit 95 and at least four tooling bores, denoted generally as 97, therethrough including a plurality of first tooling bores 97A and a plurality of second tooling bores 97B. Tooling bores 97 are drilled at predetermined locations relative to circuits 92, 95.

Test interface 10 generally comprises a pair of fixtures 20, first or lower fixture 20A and second or upper fixture 20B. The cut-away portion of upper test fixture 20B is similar to the lower portion of lower fixture 20A. Both fixtures 20 are similar except where noted. In FIG. 1, circuit board 90 is shown mounted on lower fixture 20A. Upper fixture 20B is in position to be brought into contact so that circuit board 90 is simultaneously mounted on both fixtures 20A, 20B.

Each fixture 20 generally includes a plurality of guide plates 30, guide plate support means, such as stand-off columns 70, and a plurality of translation pins 80.

Guide plates 30 include a universal grid plate or output plate 32, intermediate plates 34 and a personality plate 40. Guide plates 30 include mounting bores 39 and pin bores 31. The location of pin bores 31 in personality plates 40 determine points to be tested on circuit board 90. Each personality plate 40 includes a plurality of tooling pin bores 45.

Each stand-off column 70 includes a first end bolt 71, a second end bolt 72 and various spacers 73. Bolts 71,72 are disposed through mounting bores 39 in guide plates 30 and non-threaded spacers 73N and screw into a threaded spacer 73T. Many other configurations of columns 70 are contemplated and it is only intended to illustrate here one possible construction. Means, such as retaining second end bolt 72R, retain personality plates 40 to a column 70.

Each translation pin 80 is electrically conductive and includes a first end 82 for contact with circuit board 90 and a second end 84 for electrical connection to a test controller, not shown. Translation pins 80 are disposed through pin bores, denoted generally as 31, through guide plates 30. Pin bores 31 in universal grid plate 32 are typically in a grid pattern and pin bores 31 in personality plate 40 conform to the pattern of circuit nodes to be tested. Pin bores 31 in intermediate plates 34 are patterned to gently guide each translation pin 80 from its pin bore 31 in universal grid plate 32 to its pin bore in personality plate 40. Universal guide plate 32 retains second ends 84 of translation pins 80 in a standard grid pattern. As is known in the art, this standard grid pattern contacts a bed of nails connected to an electronic switching matrix connected to a controller with measurement circuitry.

Each translation pin bore 31 slidingly retains a translation pin 80 disposed therethrough such that second end 84 of translation pin 80 is disposed on a first side 42 of personality plate 40 and guides first end 82 for contact circuit board 90.

Figure 2:
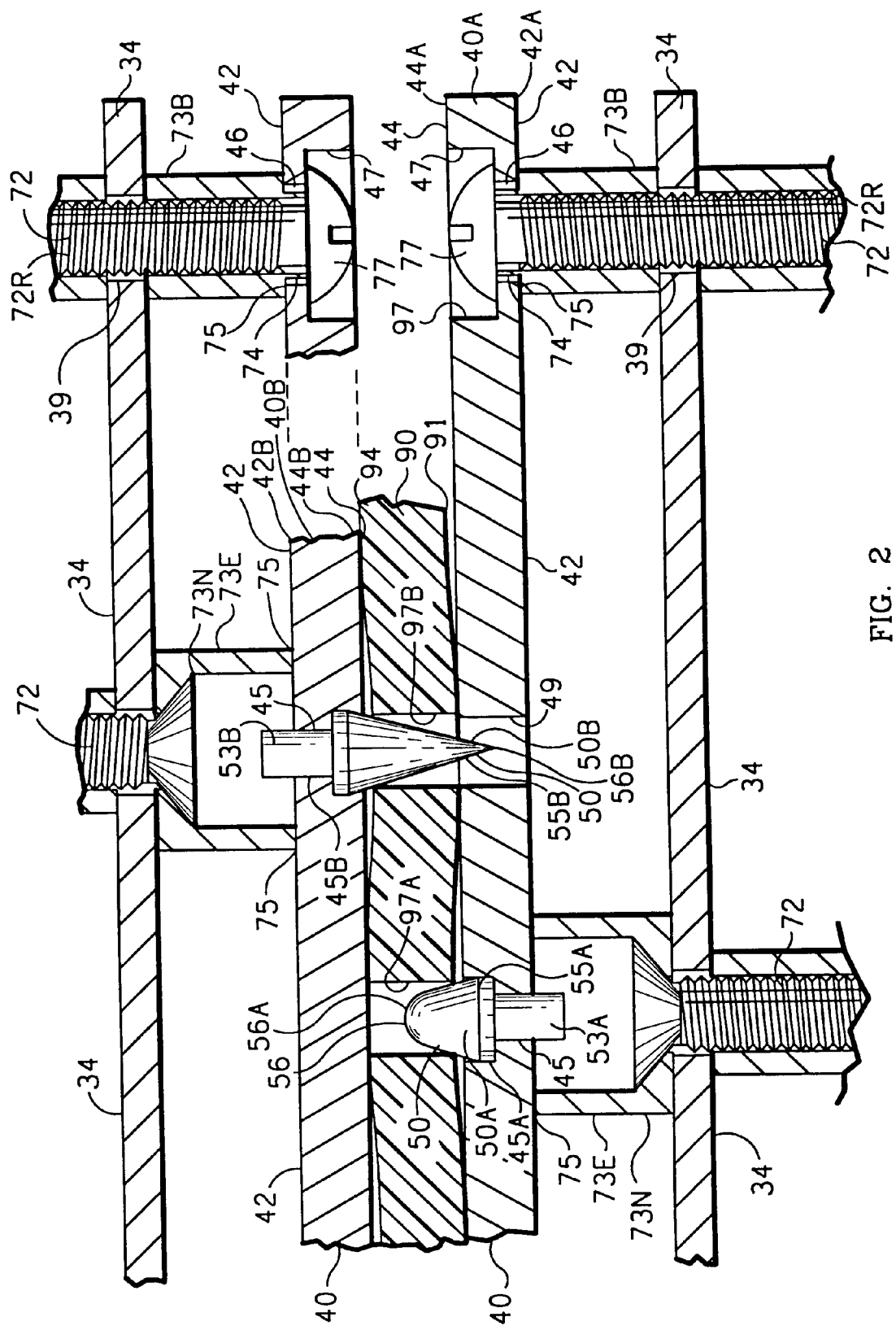
FIG. 2 is an enlarged side sectional view showing a preferred embodiment of the alignment elements.

FIG. 2, an enlarged side sectional view showing a preferred embodiment of the alignment elements, should now be referenced in addition to FIG. 1.

Lower personality plate 40A includes a first side 42A facing away from circuit board 90, a second side 44A facing toward circuit board 90 and a plurality of first tooling pin bores 45A drilled to be congruent to the plurality of first tooling bores 97A of circuit board 90.

A plurality of first tooling pins 50A are mounted in first tooling bores 45A in lower personality plate 40A. Each first tooling pin 50A has a longitudinal axis and includes a first end 53A retained in first personality plate tooling pin bore 45A and a tapered end 55A having an apex 56A centered on first personality plate tooling bore 45A and projected away from first personality plate second side 44A. Preferably, tapered end 55A is conical and may be a truncated cone. Apex 56A may be rounded or domed. Preferably, apex 56A does not extend beyond second side 94 of a mounted circuit board 90 so that when circuit board 90 is simultaneously mounted on second fixture 20B there is no interference. Preferably, tooling pin bores 45 include a counterbore for receiving the base of tapered end 55. Tapered end 55A at first personality plate second side 44A has a diameter slightly larger than the diameter of first tooling holes 97A of circuit board 90 such that circuit board 90 when mounted is maintained a slight distance from first personality plate second side 44A. Preferably, the outside diameter of tapered end 55A and inside diameter of tooling hole 97A are equal at a distance of 0.0005"–0.010" from second side 44A. The preferred distance varies somewhat with the included angle of tooling pin 50A. With a included cone angle of 30°, having the diameters equal at 0.006" from second side 44A has been found to produce good results.

Upper personality plate 40B is similar to lower personality plate 40A and includes a first side 42B facing away from circuit board 90, a second side 44B facing toward circuit board 90 and a plurality of first tooling pin bores 45B drilled to be congruent to the plurality of second tooling bores 97B of circuit board 90.

A plurality of second tooling pins 50B are mounted in second tooling bores 45B in upper personality plate 40B. Each second tooling pin 50B has a longitudinal axis and includes a first end 53B retained in second personality plate tooling pin bore 45B and a tapered end 55B having an apex 56B centered on second personality plate tooling bore 45B and projected away from second personality plate second side 44B. Preferably, tapered end 55B is conical and may be a truncated cone. Apex 56B may be pointed, as shown, or may be rounded or domed. If apex 56B extends past the opposite side, in this example past the first side 91 of mounted circuit board 90, then lower personality plate 40 must include a receiving bore 49 for accommodating apex 56B. Tapered end 55B at second personality plate second side 44B has a diameter slightly larger than the diameter of second tooling holes 97B of circuit board 90 such that circuit board 90 when mounted is maintained a slight distance from second personality plate second side 44B. Preferably, the outside diameter of tapered end 55B and inside diameter of tooling hole 97B are equal at a distance of 0.0005"–0.010" from second side 44B. The preferred distance varies somewhat with the included angle of tooling pin 50B. With a included cone angle of 30°, having the diameters equal at 0.006" from second side 44B has been found to produce good results.

The support means for one or both personality plates 40 is a compensating support means that supports its personality plate 40 such that its personality plate 40 may translate responsive to forces exerted by mounted circuit board 90 on tooling pins 50 of its personality plate 40. In the illustrated embodiment, support means for both personality plates. 40A,40B are compensating.

Lower personality plate 40A is directly supported by each end spacer 73B,73E of stand off columns 70. End spacers 73B,73E include means, such as the smooth, slippery surface of support portion 75, for both supporting personality plate 40 and permitting and facilitating movement of personality plate 40A normal to the axis of tooling pins 45.

Lower personality plate 40 includes retaining bore 46 having counterbore 47. Means, such as retaining bolt 72R, retains personality plate 40 to support surfaces 75 while also permitting its sideways movement. Retaining bolt 72R includes a head contained within counterbore 47. End spacer 73B at retaining bolt 72R is necked such that support portion 75 is a support shoulder. Retaining bore 46 is larger than the neck 74 of spacer 73B and fits loosely around neck 74. Neck 74 has a length slightly greater than the thickness of lower personality plate 40A at bore 46 such that retaining bolt 72R only loosely retains lower personality plate 40A such that lower personality plate 40A freely moves in the plane of the support surfaces 75. The compensating support means for upper personality plate 40B is similar to that for lower personality plate 40B and need not be described in detail. The only major difference is that upper personality plate 40B, in a truly upper fixture as illustrated, is upwardly retained by the head of retaining bolt 72R until the fixture closes, then it must slide on support surface 75 of its spacer 75B which consequently should be conducive to such movement.

As the fixtures 20 come together such that circuit board 90 is mounted on both, tooling pins 50, as a result of non-alignment, exert forces on personality plates 40 normal to the direction of tooling pin movement. Personality plates 40 move so as to tend to equalize these normal forces. This translation generally leads to more accurate registration. Often adequate registration is obtained by having only one personality plate 40 be so moveable. In this manner, the described apparatus minimizes tolerance buildup and achieves best alignment of translation pins.

Other compensating support means are contemplated and that illustrated is only shown by means of example. The important principle being that the personality plate be supported and yet be allowed to move normal to the axis of the tooling pins responsive to forces exerted by the mounted circuit board.

Having described the invention, it can be seen that it provides a fixture which more accurately places translation pins in contact with the test nodes on a double-sided PC board under test.

Although a particular embodiment of the invention has been illustrated and described, various changes may be made in the form, composition, construction, and arrangement of the parts without sacrificing any of its advantages. For example, although the terms bottom/top and lower/upper have been used to describe the exemplary embodiment, such terms are generally used for convenience only and could be left/right without subtracting significantly from the spirit of the invention. Also, the term circuit board is meant to include other circuit carrying devices that may be tested in the described manner. Therefore, it is to be understood that all matter herein is to be interpreted as illustrative and not in any limiting sense, and it is intended to cover in the appended claims such modifications as come within the true spirit and scope of the invention.

I claim:

1. A test interface between a circuit board to be tested and a test controller; the circuit board having: a first side having a circuit, a second side having a circuit; and at least four tooling bores therethrough including a plurality of first tooling bores and a plurality of second tooling bores; said interface comprising:

a first test fixture including:
      a plurality of first translation pins, said first translation pins being electrically conductive, each said first translation pin including:
         a first end for contact with the circuit board; and
         a second end for electrical connection to a test controller; and
      a first personality plate assembly including:
         first personality plate support means for supporting a first personality plate;
         a first personality plate supported by said first personality plate support means; said first personality plate including:
            a first side facing away from the circuit board; and
            a second side facing toward the circuit board;
            a plurality of first tooling pin bores substantially congruent to the plurality of first tooling bores of the circuit board;
            a plurality of first translation pin bores therethrough; the location of said first translation pin bores determining points to be tested on the circuit on the first side of the circuit board; each said first translation pin bore for slidingly retaining a first translation pin disposed therethrough such that said second end of said first translation pin is disposed on said first side of said first personality plate and for guiding said first end of said first translation pin for contact with the first side of the circuit board when the circuit board is mounted on said second side of said first personality plate; and
            a plurality of first tooling pins; each said first tooling pin having a longitudinal axis and including:
               a first end retained in said first personality plate tooling pin bore; and
               a tapered end having an apex centered on said first personality plate tooling pin bore and projected away from said first personality plate second side for mounting the circuit board thereon; said tapered end of each of said first tooling pins at said first personality plate second side having a diameter slightly larger than the diameter of each of the first tooling bores of the circuit board such that the circuit board when mounted is maintained a distance from said first personality plate second side, a second test fixture including:
      a plurality of second translation pins, said second translation pins being electrically conductive, each said second translation pin including:
         a first end for contact with the circuit board; and
         a second end for electrical connection to a test controller; and
      a second personality plate assembly including:
         second personality plate support means for supporting a second personality plate;
         a second personality plate supported by said second personality plate support means; said second personality plate including:
            a first side facing away from the circuit, board; and
            a second side facing toward the circuit board;
            a plurality of second tooling pin bores substantially congruent to the plurality of second tooling bores of the circuit board;
         a plurality of second translation pin bores therethrough; the location of said second translation pin bores determining points to be tested on the circuit on the second side of the circuit board; each said second translation pin bore for slidingly retaining a second translation pin disposed therethrough such that said second end of said second translation pin is disposed on said first side of said second personality plate and for guiding said first end of said second translation pin for contact with the second side of the circuit board when the circuit board is mounted on said second side of said second personality plate; and
            a plurality of second tooling pins; each said second tooling pin having a longitudinal axis and including:
               a first end retained in said second personality plate tooling pin bore; and
               a tapered end having an apex centered on said second personality plate tooling pin bore and projected away from said second personality plate second side for mounting the circuit board thereon; said tapered end of each of said second tooling pins at said second personality plate second side having a diameter slightly larger than the diameter of each of the second tooling bores of the circuit board;
   said first personality plate support means being a compensating support means supporting said first personality plate such that said first personality plate may move normal to the axis of said first tooling pins responsive to forces exerted by the mounted circuit board on said first tooling pins.

2. The test interface of claim 1, said first personality plate support means comprising:
   a plurality of first support surface means for supporting said first personality plate; and first retaining means for retaining said first personality plate to said first support surface means.

3. The test interface of claim 1:

said second personality plate support means being a compensating support means supporting said second personality plate such that said second personality plate may move normal to the axis of said second tooling pins responsive to forces exerted by the mounted circuit board on said second tooling pins.

4. The test interface of claim 3, said second personality plate support means comprising:

a plurality of second support surface means for supporting said second personality plate; and second retaining means for retaining said second personality plate to said second support surface means.

* * * * *